US 8,963,235 B1
Feb. 24, 2015

(12) United States Patent
Li

(10) Patent No.: US 8,963,235 B1
(45) Date of Patent: Feb. 24, 2015

(54) TRENCH POWER DEVICE AND SEMICONDUCTOR STRUCTURE THEREOF

(71) Applicant: Sinopower Semiconductor, Inc., Hsinchu (TW)

(72) Inventor: Po-Hsien Li, Tainan (TW)

(73) Assignee: Sinopower Semiconductor, Inc., Hsinchu (TW)

( * ) Notice: Subject to any disclaimer, the term of this patent is extended or adjusted under 35 U.S.C. 154(b) by 0 days.

(21) Appl. No.: 14/063,061

(22) Filed: Oct. 25, 2013

(51) Int. Cl.
*H01L 29/66* (2006.01)
*H01L 29/423* (2006.01)
*H01L 29/47* (2006.01)
*H01L 29/78* (2006.01)

(52) U.S. Cl.
CPC ............ *H01L 29/4236* (2013.01); *H01L 29/47* (2013.01); *H01L 29/7827* (2013.01)
USPC ............................. 257/330; 257/334; 257/335

(58) Field of Classification Search
CPC ............ H01L 29/7827; H01L 29/0657; H01L 29/872; H01L 21/30
USPC ......... 257/330–334, 347, 471, 329, 566, 368, 257/409, 34, E29.338, E29.262, E23.001, 257/E21.629, E27.03, E21.338; 438/576, 438/401, 270, 259, 156, 597, 582
See application file for complete search history.

(56) References Cited

U.S. PATENT DOCUMENTS

| | | | |
|---|---|---|---|
| 2009/0079002 A1* | 3/2009 | Lee et al. ....................... | 257/355 |
| 2011/0097894 A1* | 4/2011 | Andrews et al. ............... | 438/618 |
| 2012/0276701 A1* | 11/2012 | Yedinak et al. ............... | 438/270 |
| 2014/0042535 A1* | 2/2014 | Darwish et al. ............... | 257/334 |
| 2014/0048869 A1* | 2/2014 | Yedinak et al. ............... | 257/330 |

* cited by examiner

*Primary Examiner* — Amar Movva
*Assistant Examiner* — Sheikh Maruf
(74) *Attorney, Agent, or Firm* — Rosenberg, Klein & Lee

(57) ABSTRACT

A semiconductor structure of a trench power device comprises a base, an insulating layer, and a source conductive layer. The base includes a first trench etched from the top surface thereof, and two portions of the top surface arranged at two opposite sides of the first trench are respectively defined as two top contacting surfaces. Part of the first trench is filled with the insulating layer, and two inner walls of a non-filled portion of the first trench are respectively defined as two side contacting surfaces without contacting the insulating layer. The source conductive layer is embedded in the insulating layer. Thus, when a metallic layer is integrally formed on the semiconductor structure and connects the top contacting surfaces and the side contacting surfaces, the top contacting surfaces and the side contacting surfaces are configured to be a Schottky barrier interface.

10 Claims, 4 Drawing Sheets

TRENCH POWER DEVICE AND SEMICONDUCTOR STRUCTURE THEREOF

BACKGROUND OF THE INVENTION

1. Field of the Invention

The instant disclosure relates to a semiconductor device; more particularly, to a trench power device and a semiconductor structure thereof.

2. Description of Related Art

When an electric current applied on the junction barrier Schottky (JBS) construction is too large, the JBS construction easily increases the forward voltage (Vf) to generate the body diode effect, thereby influencing the effect of the JBS construction. Thus, the trench MOS barrier Schottky (TMBS) construction is applied on the power device for avoiding the body diode effect and having a better effect.

However, the Schottky barrier interference of the conventional TMBS construction is only located at the top surface of the epitaxial layer, such that the size of the conventional TMBS construction is too larger.

To achieve the abovementioned improvement, the inventors strive via industrial experience and academic research to present the instant disclosure, which can provide additional improvement as mentioned above.

SUMMARY OF THE INVENTION

One embodiment of the instant disclosure provides a trench power device and a semiconductor structure thereof for reducing the size of the TMBS area thereof with respect to the conventional TMBS construction.

The trench power device in the instant disclosure comprises: a semiconductor structure defines a shielding gate area and a trench MOS barrier Schottky (TMBS) area adjacent to the shielding gate area, and the semiconductor structure comprising: a base having a top surface, wherein the base includes a first trench arranged at the TMBS area and etched from the top surface of the base, two portions of the top surface arranged at two opposite sides of the first trench and in the TMBS area are respectively defined as two top contacting surfaces; an insulating layer, wherein part of the first trench is filled with the insulating layer, two inner walls of a non-filled portion of the first trench are respectively defined as two side contacting surfaces without contacting the insulating layer; a source conductive layer embedded in the insulating layer; and a metallic layer integrally formed on the shielding gate area and the TMBS area, wherein the metallic layer connects the top contacting surfaces and the side contacting surfaces for causing the top contacting surfaces and the side contacting surfaces to be a Schottky barrier interface.

Preferably, the base includes two second trenches arranged at the TMBS area and etched from the top surface of the base, the second trenches are arranged at two opposite sides of the first trench, part of each second trench is filled with the insulating layer, an inner wall of a non-filled portion of each second trench adjacent to the first trench is defined as a stretch contacting surface without contacting the insulating layer, and wherein the metallic layer connects the stretch contacting surfaces for causing the top contacting surfaces, the side contacting surfaces, and the stretch contacting surfaces to be the Schottky barrier interface.

The semiconductor structure of a trench power device in the instant disclosure comprises: a base having a top surface, wherein the base includes a first trench etched from the top surface thereof, two portions of the top surface arranged at two opposite sides of the first trench are respectively defined as two top contacting surfaces; an insulating layer, wherein part of the first trench is filled with the insulating layer, two inner walls of a non-filled portion of the first trench are respectively defined as two side contacting surfaces without contacting the insulating layer; and a source conductive layer embedded in the insulating layer; wherein the top contacting surfaces and the side contacting surfaces are configured to be a Schottky barrier interface, when a metallic layer is integrally formed on the semiconductor structure and connects the top contacting surfaces and the side contacting surfaces.

In summary, the trench power device and the semiconductor structure of the instant disclosure each is provided with the side contacting surfaces (and the stretch contacting surfaces), which are arranged at TMBS area and connected to the metallic layer, for increasing the measure of area of the Schottky barrier interface, thereby decreasing the size of TMBS area of the trench power device and the semiconductor structure.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Please refer to FIGS. 1 through 8, which show an embodiment of the instant disclosure. References are hereunder made to the detailed descriptions and appended drawings in connection with the instant disclosure. However, the appended drawings are merely shown for exemplary purposes, rather than being used to restrict the scope of the instant disclosure.

Figure 1:
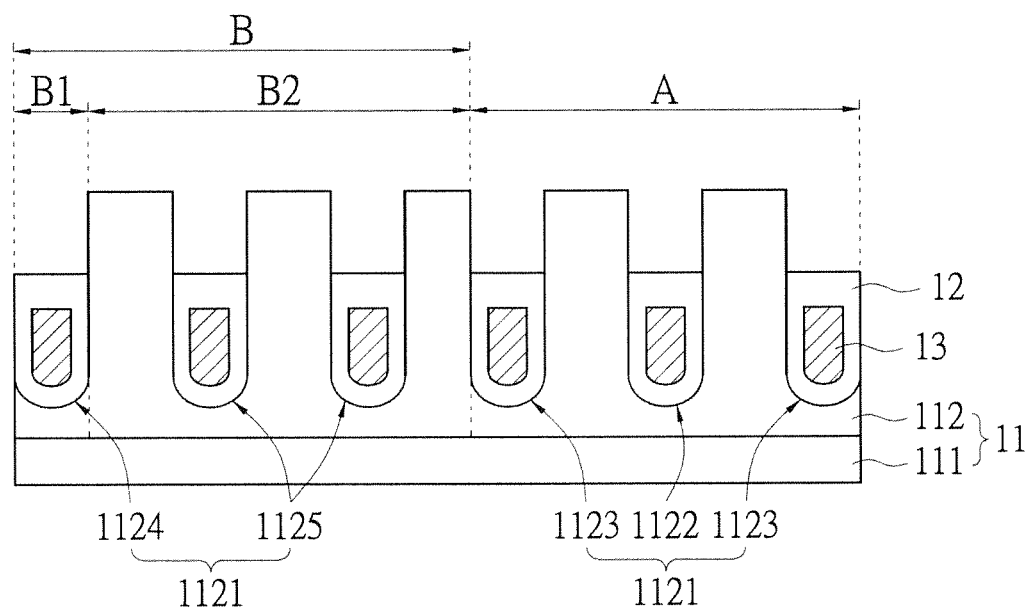
FIG. 1 is a cross-sectional view of a manufacturing method of a trench power device according to the step S110 of the instant disclosure.

The instant embodiment discloses a manufacturing method of a trench power device 100 firstly for conveniently understanding the instant embodiment. The instant embodiment takes an unit portion of the trench power device 100 for example, and explaining the trench power device 100 by the cross-sectional view of the unit portion. Please refer to the figure corresponding to each step, and with reference occasionally made to the other figures. The manufacturing method of the trench power device 100 includes a plurality of steps S110~S160 as follows:

Step S110: as shown in FIG. 1, etching a top surface of a base 11 to form a plurality of trenches 1121, disposing an insulative material in the lower-half portion of the trenches 1121 to form an insulating layer 12, and embedding a source conductive layer 13 in the insulating layer 12.

The base 11 includes a substrate 111 and an epitaxial layer 112 formed on the substrate 111. The conductivity type of substrate 111 in the instant embodiment is $N^+$ type, and the conductivity type of epitaxial layer 112 in the instant embodiment is $P^+$ type. The insulating layer 12 can be made of silicon-oxygen compound or the other suitable dielectric material, and the source conductive layer 13 is made of doped poly-silicon, but the instant disclosure is not limited thereto.

Moreover, the base 11 defines a shielding gate area B and a trench MOS barrier Schottky (TMBS) area A adjacent to the shielding gate area B. The shielding gate area B includes a terminal area B1 and a cell area B2 arranged between the terminal area B1 and the TMBS area A.

The trenches 1121 in the instant embodiment are further defined according to the areas. Specifically, the trenches 1121 arranged at the TMBS area A are defined as a first trench 1122 and two second trenches 1122 arranged at two opposite sides of the first trench 1122, the trench 1121 arranged in the terminal area B1 is defined as a contact trench 1124, and the trenches 1121 arranged in the cell area B2 are defined as two gate trenches 1125.

Figure 2:
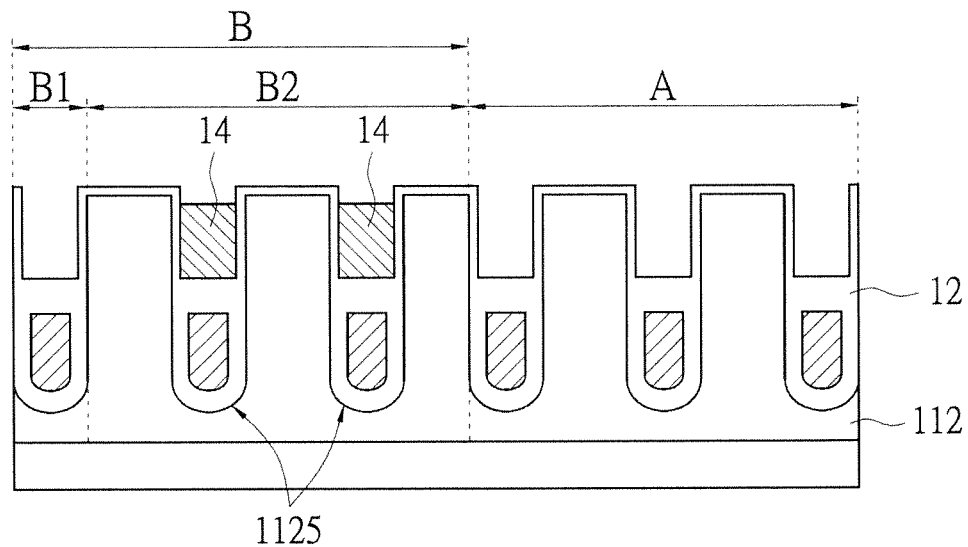
FIG. 2 is a cross-sectional view of the manufacturing method of the trench power device according to the step S120 of the instant disclosure.

A separating portion of the insulating layer 12 arranged above the source conductive layer 13 is formed by low temperature oxide (LTO) deposition, until the thickness of the separating portion of the insulating layer 12 achieves a predetermined value, thereby preventing a short circuit generated between the source conductive layer 13 and the respective gate conductive layer 14, which are arranged at the same gate trench 1125 (as shown in FIG. 2).

Additionally, the above trenches 1121 are disclosed according to the cross-sectional views, so that the trenches 1121 may be separated with each other. However, when the above trenches 1121 in a three dimensional view, the trenches 1121 may be separated with each other or communicated with each other, the instant embodiment is not limited thereto. Moreover, the source conductive layer 13 may also be separated with each other or communicated with each other.

Step S120: as shown in FIG. 2, disposing an insulative material to expand the insulating layer 12 for covering an exposing surface of the epitaxial layer 112 as shown in FIG. 1, and forming a gate conductive layer 14 in the upper-half portion of the gate trenches 1125, in which the top surface of the gate conductive layer 14 exposes from the insulating layer 12 and under the top surface of the insulating layer 12. The gate conductive layer 14 is made of doped poly-silicon, but the instant disclosure is not limited thereto.

Figure 3:
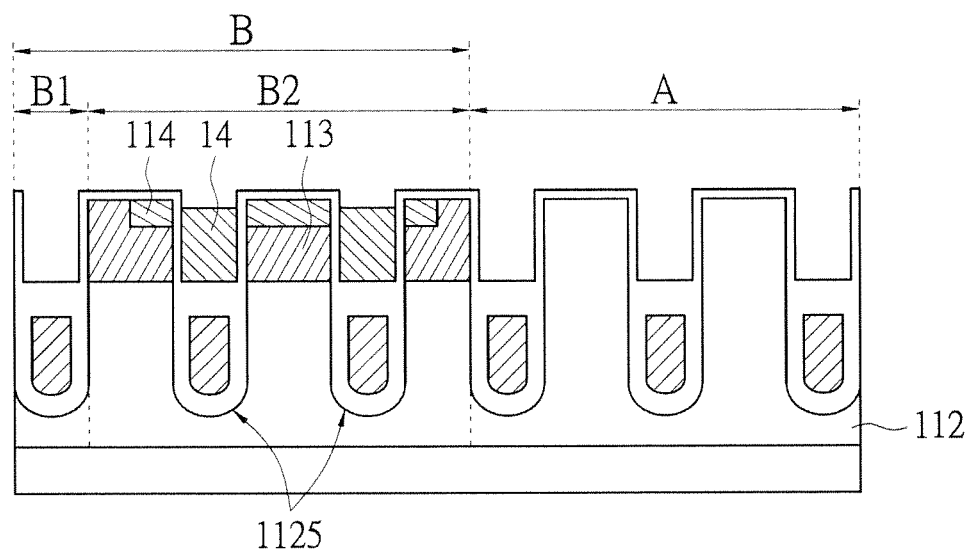
FIG. 3 is a cross-sectional view of the manufacturing method of the trench power device according to the step S130 of the instant disclosure.

Step S130: as shown in FIG. 3, implementing an ion implanting process to the top surface of the epitaxial layer 112 arranged in the cell area B2 to form a top portion of the epitaxial layer 112 arranged in the cell area B2 into a doped body region 113, and then implementing an ion implanting process to the top surface of doped body region 113 to form a top portion of the doped body region 113 into a S/D region 114.

The doped body region 113 is arranged outside the gate conductive layer 14, and the depth of the doped body region 113 is not greater than the depth of the gate conductive layer 14. Specifically, the doped body region 113 approximately contact the upper-half portion of the gate trenches 1125. The conductivity type of doped body region 113 is different from the conductivity type of substrate 111, that is to say, the conductivity type of doped body region 113 in the instant embodiment is P type. The S/D region 114 contacts the top part of the upper-half portion of the gate trenches 1125, and the SAD region 114 is separated from the epitaxial layer 112 by the doped body region 113.

Figure 4:
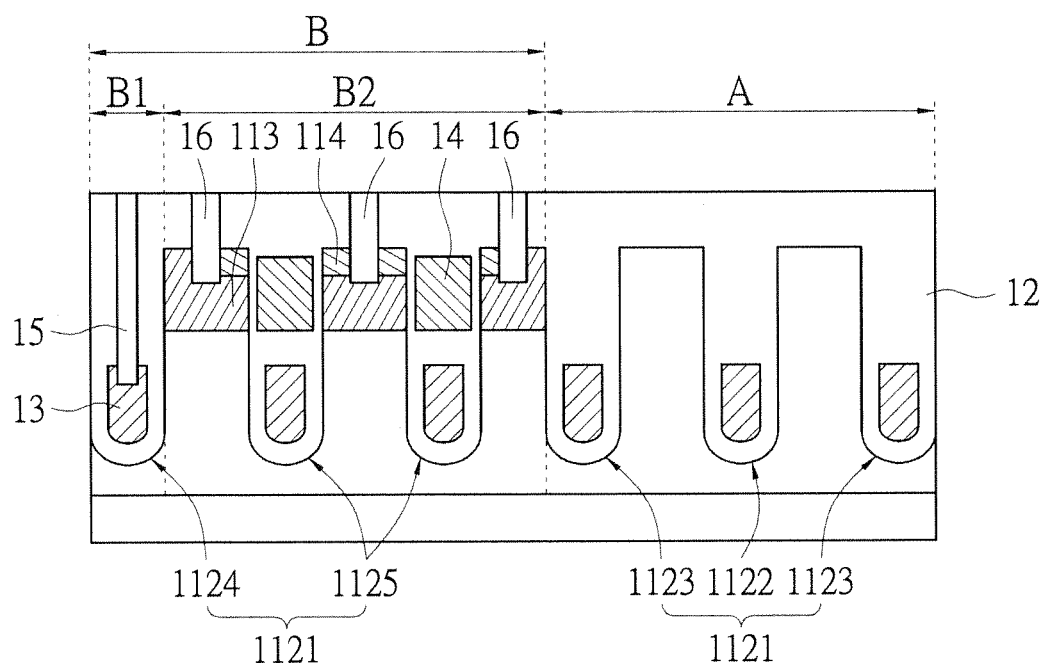
FIG. 4 is a cross-sectional view of the manufacturing method of the trench power device according to the step S140 of the instant disclosure.

Step S140: as shown in FIG. 4, disposing an insulative material to expand the insulating layer 12 to cause the trenches 1121 filled with the insulating layer 12 and the gate conductive layer 14 embedded in the insulating layer 12, and then forming a pillar-like first contact 15 in the contact trench 1124 at the terminal area B1 and three pillar-like second contacts 15 at the cell area B2. Specifically, the first contact 15 is embedded in the insulating layer 12, in which one end of the first contact 15 (i.e., the bottom end) is connected to the source conductive layer 13 embedded in the insulating layer 12 of the contact trench 1124, and another end of the first contact 15 (i.e., the top end) is exposed from the insulating layer 12 of the contact trench 1124. The second contacts 16 are embedded in the insulating layer 12 and the base 11, in which one end of the second contacts 16 (i.e., the bottom end) contact the S/D region 114 and the doped body region 113, and another end of the second contacts 16 (i.e., the top end) away from the doped body region 113 are exposed from the insulating layer 12.

Figure 5:
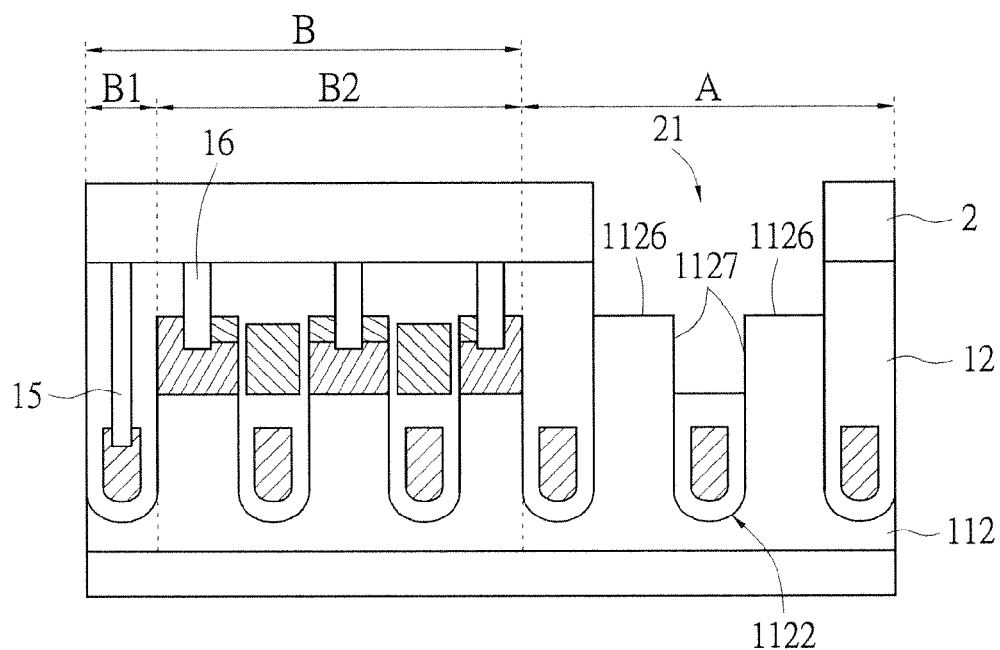
FIG. 5 is a cross-sectional view of the manufacturing method of the trench power device according to the step S150 of the instant disclosure.

Step S150: as shown in FIG. 5, forming a photoresist layer 2 on the insulating layer 12 and the outer surface of the first and second contacts 15, 16 exposed from the insulating layer, in which an opening 21 is formed on the photoresist layer 2 and aligns the first trench 1122 and the medium portion of the epitaxial layer 112 arranged between the first and second trenches 1122, 1123; and then dry etching the insulating layer 12 via the opening 21 to remove the portion of the insulating layer 12 corresponding to the opening 21, such that two inner walls of the upper-half portion of the first trench 1122 and the top surface of the medium portion of the epitaxial layer 112 arranged between the first and second trenches 1122, 1123 are exposed to the air.

The exposed inner walls of the upper-half portion of the first trench 1122 are respectively defined as two side contacting surfaces 1127, and the exposed top surface of the medium portion of the epitaxial layer 112 arranged between the first and second trenches 1122, 1123 are respectively defined as two top contacting surfaces 1126. Specifically, the side contacting surfaces 1127 are respectively perpendicular to the top contacting surfaces 1126.

Figure 6:
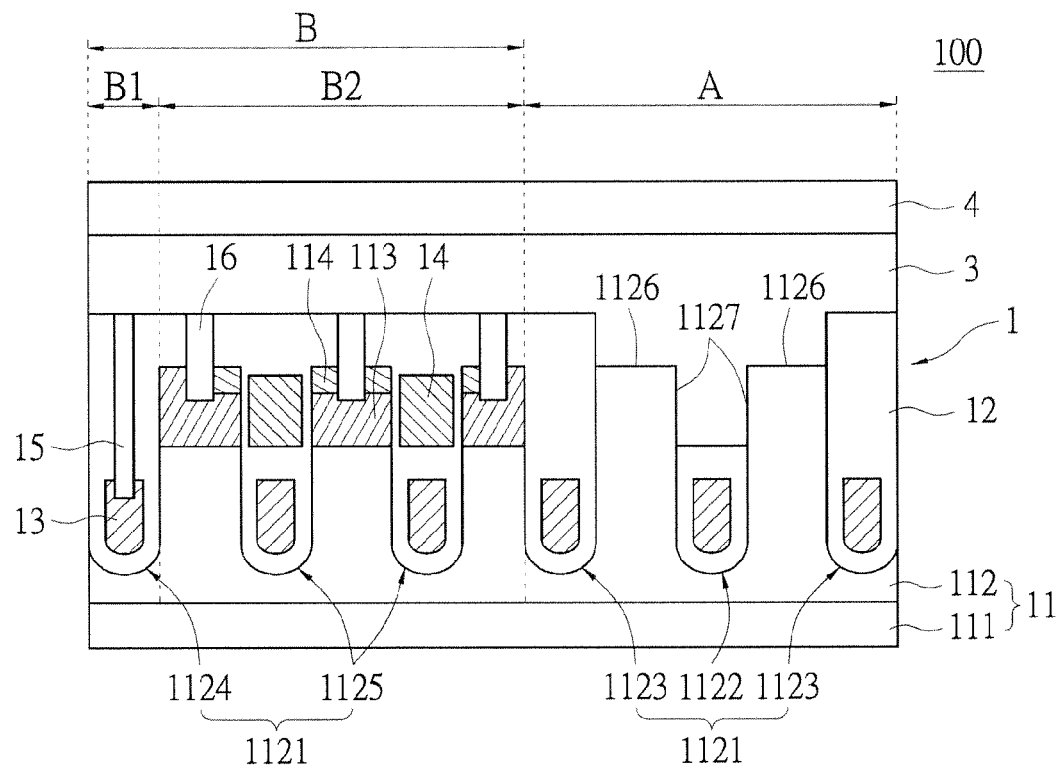
FIG. 6 is a cross-sectional view of the manufacturing method of the trench power device according to the step S160 of the instant disclosure.

Step S160: as shown in FIG. 6, removing the photoresist layer 2, forming a metallic layer 3 on the insulating layer 12, the exposed surfaces of the first and second contacts 15, 16, the top contacting surfaces 1126, and the side contacting surfaces 1127; and then forming a passivation layer 4 on the metallic layer 3.

Figure 7:
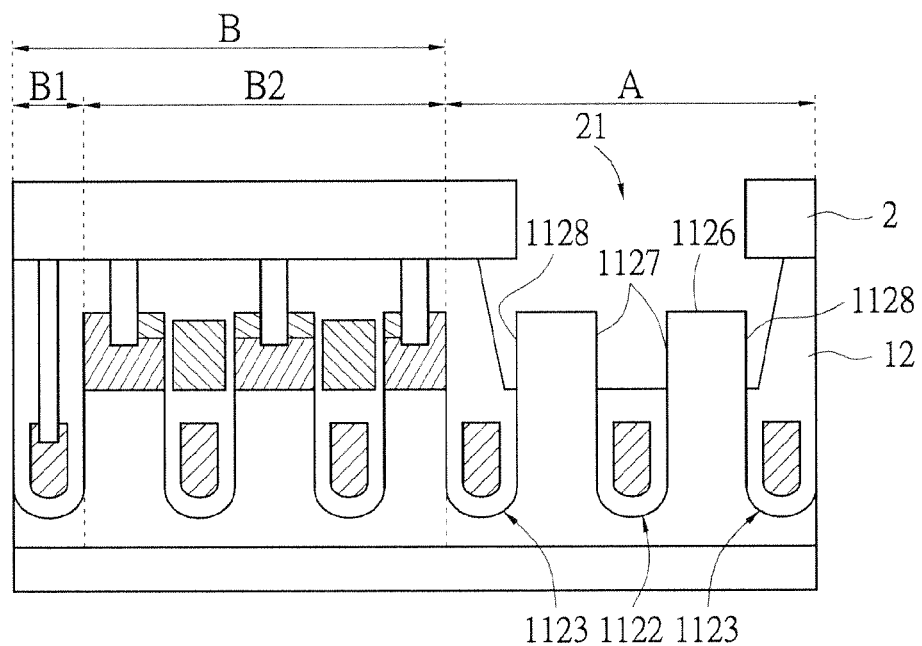
FIG. 7 is a cross-sectional view of the manufacturing method of the trench power device according to the step S150' of the instant disclosure.
Figure 8:
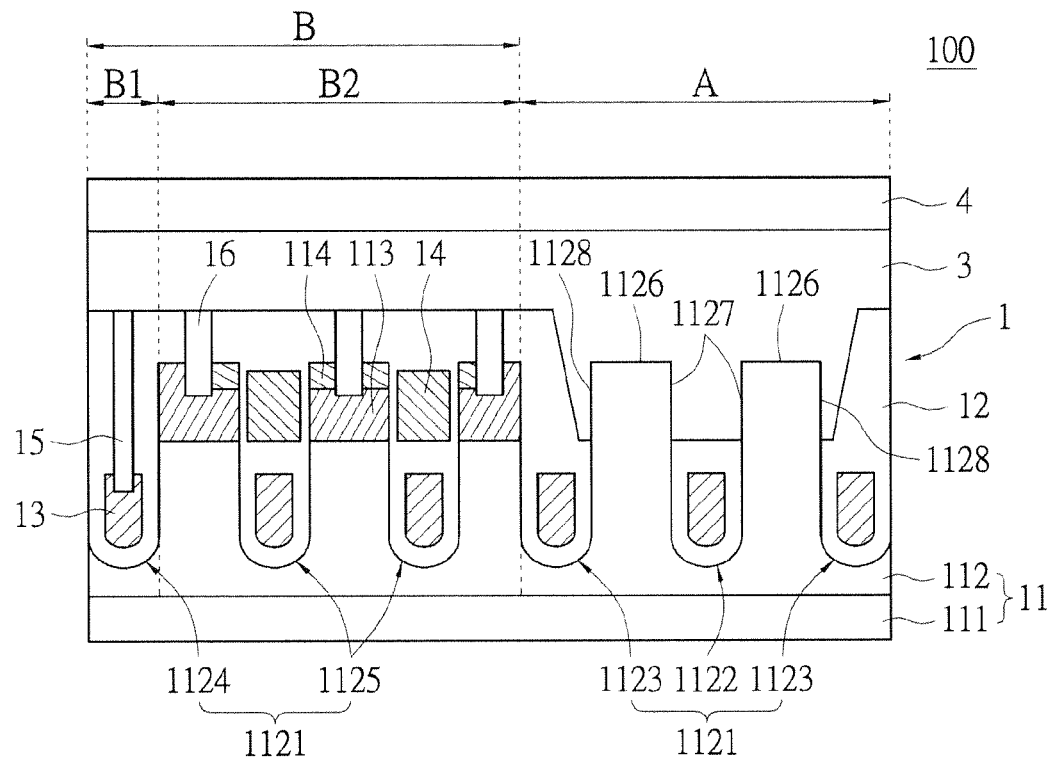
FIG. 8 is a cross-sectional view of the manufacturing method of the trench power device according to the step S160' of the instant disclosure.

The trench power device 100 as shown in FIG. 6 is manufactured by implanting the above steps S110 to S160, but each step can be replaced with reasonable variety step. For example, please refer to FIGS. 7 and 8, a step S150' as shown in FIG. 7 is changed from the step S150, and a step S160' as shown in FIG. 8 is changed from the step S160. Specifically, the dry etching process of the step S150 is replaced by a wet etching process of the step S150', and the detail description is disclosed as follows.

Step S150': as shown in FIG. 7, after forming of the photoresist layer 2 of the step S150, wet etching the insulating layer 12 via the opening 21 to remove the portion of the insulating layer 12 aligning the opening 21, and part of the insulating layer 12 arranged in the second trenches 1123 is removed at the same time by the lateral etching effect generated from the wet etching.

Moreover, comparing to the step S150, an inner wall of each second trench 1123 after the step S150', which is adjacent to the first trench 1122 and without contact the insulating layer 12, is defined as a stretch contacting surface 1128. In other words, in the step S150', the top contacting surfaces 1126, the side contacting surfaces 1127, and the stretch contacting surfaces 1128 are exposed to the air by the wet etching.

Step S160': as shown in FIG. 8, removing the photoresist layer 2, forming a metallic layer 3 on the insulating layer 12, the exposed surfaces of the first and second contacts 15, 16, the top contacting surfaces 1126, the side contacting surfaces 1127, and the stretch contacting surfaces 1128; and then forming a passivation layer 4 on the metallic layer 3.

The above description has been disclosed the steps of the manufacturing method of the trench power device 100 according to the cross-sectional views of the trench power device. The instant disclosure can be formed with any possible layout if achieving the above steps. That is to say, if observing from the top view of the trench power device 100, the trench power device 100 can be adjusted from a plurality of different arrangements.

The following description discloses the structural features of the trench power device 100 as shown in FIGS. 6 and 8, and some structural features of the trench power device 100 is disclosed in the above step description, so that the following description does not disclose again.

Please refer to FIG. 6, which shows a trench power device 100 including a semiconductor structure 1, a metallic layer 3, and a passivation layer 4. The metallic layer 3 is integrally formed on the semiconductor structure 1, and the passivation layer 4 is formed on the metallic layer 3.

The semiconductor structure 1 defines a shielding gate are B and a TMBS area A beside the shielding gate area B. The shielding gate area B includes a terminal area B1 and a cell area B2 arranged between the terminal area B1 and the TMBS area A.

Moreover, the semiconductor structure 1 includes a base 11, an insulating layer 12, a source conductive layer 13, a gate conductive layer 14, a first contact 15, and three second contacts 16.

A first trench 1122 and two second trenches 1122 are formed by etching a portion of the top surface of the base 11 arranged at the TMBS area A, and the second trenches 1123 are respectively formed at two opposite sides of the first trench 1122. A contact trench 1124 is formed by etching a portion of the top surface of the base 11 arranged at the terminal area B1, and two gate trenches 1125 are formed by etching a portion of the top surface of the base 11 arranged at the cell area B2.

The first trench 1122, the second trenches 1123, the contact trench 1124, and the gate trenches 1125 have the same depth with respect to the semiconductor structure 1. Two portions of the top surface arranged at two opposite sides of the first trench 1122 and in the TMBS area A are respectively defined as two top contacting surfaces 1126.

The insulating layer 12 is filled in part of the first trench 1122, all of the second trenches 1123, all of the contact trench 1124, and all of the gate trenches 1125, and the insulating layer 12 has a covering portion formed on the base 11. The insulating layer 12 arranged at the shielding gate area B and the TMBS area A is an integral structure.

Moreover, two inner walls of a non-filled portion of the first trench 1122 are respectively defined as two side contacting surfaces 1127 without contacting the insulating layer 12. The side contacting surfaces 1127 are respectively perpendicular to the top contacting surfaces 1126, and the measure of area of the side contacting surfaces 1127 is greater than or equal to the measure of area of the top contacting surfaces 1126. In the instant embodiment, the measure of area of the side contacting surfaces 1127 is equal to the measure of area of the top contacting surfaces 1126.

The source conductive layer 13 is embedded in the insulating layer 12 and arranged at the lower-half portion of each of the first trench 1122, the second trench 1123, the contact trench 1124, and the gate trench 1125. Moreover, the source conductive layer 13 is arranged at the first trench 1122, the second trenches 1123, the contact trench 1124, and the gate trenches 1125 with the same depth.

The gate conductive layer 14 is embedded in the insulating layer 12 of the gate trenches 1125 and arranged at the upper-half portion of the gate trenches 1125, that is to say, the gate conductive layer 14 is arranged above the source conductive layer 13 embedded in the insulating layer 12 of the gate trenches 1125.

The first contact 15 is embedded in the insulating layer 12 of the contact trench 1124, in which one end of the first contact 15 (i.e., the bottom end) is connected to the source conductive layer 13 embedded in the insulating layer 12 of the contact trench 1124, and another end of the first contact 15 (i.e., the top end) is coplanar with the top surface of the insulating layer 12.

The second contacts 16 are arranged at the cell area B2 and embedded in the covering portion of the insulating layer 12 and the base 11, in which one end of the second contacts 16 (i.e., the top end) away from the base 11 are coplanar with the top surface of the insulating layer 12, and another end of the second contacts 16 (i.e., the bottom end) embedded in the base 11 are respectively arranged at two sides of the upper portion of the gate conductive layer 14. The length of each second contact 16 is smaller than the length of the first contact 15.

The metallic layer 3 is integrally formed on the semiconductor structure 1 and connected to the top contacting surfaces 1126, the side contacting surfaces 1127, the top end of the first contact 15, and the top end of each second contact 16, thereby causing the top contacting surfaces 1126 and the side contacting surfaces 1127 to be a Schottky barrier interface. That is to say, the size of the trench power device 100 is smaller than the conventional by forming the side contacting surfaces 1127 to increase the area of the Schottky barrier interface.

Specifically, when the number of trench formed in the TMBS area A of the trench power device 100 as shown in FIG. 6 is equal to the number of trench of the conventional TMBS construction, the measure of area of the Schottky barrier interface of the trench power device 100 as shown in FIG. 6 is double the measure of area of the Schottky barrier interface of the conventional TMBS construction.

In other words, when the measure of area of the Schottky barrier interface of the trench power device 100 as shown in FIG. 6 is equal to the measure of area of the Schottky barrier interface of the conventional TMBS construction, the number of trench formed in the TMBS area A of the trench power device 100 as shown in FIG. 6 is half the number of trench of the conventional TMBS construction. Thus. the size of the TMBS area A of the trench power device 100 as shown in FIG. 6 is approximately half the size of the conventional TMBS construction.

Please refer to FIG. 8, which shows a construction similar to the construction as shown in FIG. 6, and the difference there-between is the contact area of the metallic layer 3 and the base 11 arranged at the TMBS area A. The difference is disclosed as follows.

The insulating layer 12 is filled in part of each second trench 1123. An inner wall of each second trench 1123, which is adjacent to the first trench 1122 and without contact the insulating layer 12, is defined as a stretch contacting surface 1128. The stretch contacting surfaces 1128 are respectively perpendicular to the top contacting surfaces 1126, and each stretch contacting surface 1128 and the adjacent side contacting surface 1127 are connected to two opposite edges of the corresponding top contacting surface 1126.

Moreover, the measure of area of the stretch contacting surfaces 1128 in the instant embodiment is substantially equal to the measure of area of the top contacting surfaces 1126, but the instant disclosure is not limited thereto. For example, the measure of area of the stretch contacting surfaces 1128 can be greater than the measure of area of the top contacting surfaces 1126.

The metallic layer 3 connects the top contacting surfaces 1126, the side contacting surfaces 1127, and the stretch contacting surfaces 1128, thereby causing the top contacting surfaces 1126, the side contacting surfaces 1127, and the stretch contacting surfaces 1128 to be the Schottky barrier interface. That is to say, the size of the trench power device 100 is further smaller than the conventional by forming the side contacting surfaces 1127 and the stretch contacting surfaces 1128 to increase the area of the Schottky barrier interface.

Specifically, when the number of trench formed in the TMBS area A of the trench power device 100 as shown in FIG. 8 is equal to the number of trench of the conventional TMBS construction, the measure of area of the Schottky barrier interface of the trench power device 100 as shown in FIG. 8 is triple the measure of area of the Schottky barrier interface of the conventional TMBS construction.

In other words, when the measure of area of the Schottky barrier interface of the trench power device 100 as shown in FIG. 8 is equal to the measure of area of the Schottky barrier interface of the conventional TMBS construction, the number of trench formed in the TMBS area A of the trench power device 100 as shown in FIG. 8 is one-third of the number of trench of the conventional TMBS construction. Thus, the size of the TMBS area A of the trench power device 100 as shown in FIG. 8 is approximately one-third of the size of the conventional TMBS construction.

Moreover, the size of TMBS area A of the trench power device 100 can be changed by forming different measure of area of the side contacting surface 1127 and the stretch contacting area 1128.

Additionally, the TMBS area A in the instant embodiment is integrally formed with the shielding gate area B, but the instant disclosure is not limited thereto. But in the manufacturing process, the TMBS area A integrally formed with the shielding gate area B can be capable of easier manufacturing process.

[The Possible Effects of the Instant Embodiment]

In summary, the trench power device of the instant embodiment is provided with the side contacting surfaces (and the stretch contacting surfaces), which are arranged at TMBS area and connected to the metallic layer, for increasing the measure of area of the Schottky barrier interface, thereby decreasing the size of the TMBS area of the trench power device.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A trench power device, comprising:
a semiconductor structure defines a shielding gate area and a trench MOS barrier Schottky (TMBS) area adjacent to the shielding gate area, and the semiconductor structure comprising:
a base having a top surface, wherein the base includes a first trench arranged at the TMBS area and etched from the top surface of the base, two portions of the top surface arranged at two opposite sides of the first trench and in the TMBS area are respectively defined as two top contacting surfaces;
an insulating layer, wherein part of the first trench is filled with the insulating layer, two inner walls of a portion of the first trench, not filled with insulating layer, are respectively defined as two side contacting surfaces without contacting the insulating layer;
a source conductive layer embedded in the insulating layer; and
a metallic layer integrally formed on the shielding gate area and the TMBS area, wherein the metallic layer connects the top contacting surfaces and the side contacting surfaces for causing the top contacting surfaces and the side contacting surfaces to be a Schottky barrier interface.

2. The trench power device according to claim 1, wherein the side contacting surfaces are respectively perpendicular to the top contacting surfaces, and the measure of area of the side contacting surfaces is greater than or equal to the measure of area of the top contacting surfaces.

3. The trench power device according to claim 1, wherein the shielding gate area includes a terminal area and a cell area arranged between the terminal area and the TMBS area, the base has a contact trench formed in the terminal area, and the contact trench is filled with the insulating layer; the semiconductor structure comprises a first contact embedded in the insulating layer of the contact trench, one end of the first contact is connected to the source conductive layer embedded in the insulating layer of the contact trench, and another end of the first contact is connected to the metallic layer.

4. The trench power device according to claim 3, wherein the base has a gate trench formed in the cell area, the gate trench is filled with the insulating layer, and a covering portion of the insulating layer is formed on the top surface of the base; the semiconductor structure comprises a gate conductive layer and two second contacts, the gate conductive layer is embedded in the insulating layer of the gate trench and arranged above the source conductive layer embedded in the insulating layer of the gate trench, the gate conductive layer is closer to the metallic layer than the source conductive layer, the second contacts are arranged at the cell area and embedded in the covering portion of the insulating layer and the base, one end of the second contacts away from the base are connected to the metallic layer, another end of the second contacts embedded in the base are respectively arranged at two sides of the gate conductive layer.

5. The trench power device according to claim 4, wherein the depth of the first trench, the depth of the contact trench, and the depth of the gate trench are substantially identical in reference to the semiconductor structure.

6. The trench power device according to claim 4, wherein the source conductive layer is arranged at the first trench, the contact trench, and the gate trench with the same depth.

7. The trench power device according to claim 1, wherein the base includes two second trenches arranged at the TMBS area and etched from the top surface of the base, the second trenches are arranged at two opposite sides of the first trench, part of each second trench is filled with the insulating layer, an inner wall of a portion of each second trench, not filled with insulating layer, adjacent to the first trench is defined as a stretch contacting surface without contacting the insulating layer, and wherein the metallic layer connects the stretch contacting surfaces for causing the top contacting surfaces, the side contacting surfaces, and the stretch contacting surfaces to be the Schottky barrier interface.

8. The trench power device according to claim 7, wherein the stretch contacting surfaces are respectively perpendicular to the top contacting surfaces, and the measure of area of the stretch contacting surfaces is greater than or equal to the measure of area of the top contacting surfaces.

9. A semiconductor structure of a trench power device, comprising:
   a base having a top surface, wherein the base includes a first trench etched from the top surface thereof, two portions of the top surface arranged at two opposite sides of the first trench are respectively defined as two top contacting surfaces;
   an insulating layer, wherein part of the first trench is filled with the insulating layer, two inner walls of a portion of the first trench, not filled with insulating layer, are respectively defined as two side contacting surfaces without contacting the insulating layer;
   a source conductive layer embedded in the insulating layer;
   wherein the top contacting surfaces and the side contacting surfaces are configured to be a Schottky barrier interface, when a metallic layer is integrally formed on the semiconductor structure and connects the top contacting surfaces and the side contacting surfaces.

10. The semiconductor structure according to claim 9, wherein the base includes two second trenches arranged at the TMBS area and etched from the top surface of the base, the second trenches are arranged at two opposite sides of the first trench, part of each second trench is filled with the insulating layer, an inner wall of a Portion of each second trench, not filled with insulating layer, adjacent to the first trench is defined as a stretch contacting surface without contacting the insulating layer, and wherein the top contacting surfaces, the side contacting surfaces, and the stretch contacting surfaces are configured to be the Schottky barrier interface, when the metallic layer is integrally formed on the semiconductor structure and connects the stretch contacting surfaces.

* * * * *